(12) United States Patent
Godin et al.

(10) Patent No.: US 9,031,104 B2
(45) Date of Patent: May 12, 2015

(54) LOW INDUCTANCE LASER DIODE BAR MOUNT

(75) Inventors: Jacques Godin, Quebec (CA); Martin Grenier, Quebec (CA); Louis Demers, Saint-Romuald (CA)

(73) Assignee: Obzerv Technologies Inc.

( * ) Notice: Subject to any disclaimer, the term of this patent is extended or adjusted under 35 U.S.C. 154(b) by 37 days.

(21) Appl. No.: 14/118,501

(22) PCT Filed: May 7, 2012

(86) PCT No.: PCT/CA2012/050298
§ 371 (c)(1),
(2), (4) Date: May 20, 2014

(87) PCT Pub. No.: WO2012/151694
PCT Pub. Date: Nov. 15, 2012

(65) Prior Publication Data
US 2014/0247846 A1    Sep. 4, 2014

Related U.S. Application Data

(60) Provisional application No. 61/484,297, filed on May 10, 2011.

(51) Int. Cl.
| | |
|---|---|
| *H01S 3/04* | (2006.01) |
| *H01S 5/022* | (2006.01) |
| *H01S 5/40* | (2006.01) |
| *H01S 5/024* | (2006.01) |
| *H01S 5/062* | (2006.01) |

(52) U.S. Cl.
CPC ....... *H01S 5/02236* (2013.01); *Y10T 29/49947* (2015.01); *Y10T 29/49826* (2015.01); *H01S 5/02264* (2013.01); *H01S 5/02276* (2013.01); *H01S 5/02438* (2013.01); *H01S 5/02469* (2013.01); *H01S 5/06216* (2013.01); *H01S 5/4025* (2013.01)

(58) Field of Classification Search
USPC .................... 372/34, 36, 38.1, 38.02, 50.1
See application file for complete search history.

(56) References Cited

U.S. PATENT DOCUMENTS

| | | |
|---|---|---|
| 3,590,328 A | 6/1971 | Frescura et al. |
| 3,628,483 A | 12/1971 | Pauza |
| 4,719,631 A | 1/1988 | Conaway |
| 4,739,447 A | 4/1988 | Lecomte |
| 5,038,356 A | 8/1991 | Botez et al. |

(Continued)

FOREIGN PATENT DOCUMENTS

| | | |
|---|---|---|
| DE | 102004036931 A1 | 3/2006 |
| WO | 2011019856 A1 | 2/2011 |

OTHER PUBLICATIONS

Monochrom Laser Diode Devices, Laser Diode Bar Assemblies Description, Catalogue, http://www.monocrom.com/PDF/LDBA.pdf.

*Primary Examiner* — Dung Nguyen
(74) *Attorney, Agent, or Firm* — GrayRobinson, P.A.

(57) ABSTRACT

The laser mount arrangement can have a laser bar and a driver positioned adjacent to one another and secured against a connection face of a heat sink base. The heat sink base is connected to and forms a first electrical connection between the laser bar and the driver. A second electrical connection is also provided between the laser bar and the driver opposite the heat sink base, which can be in the form of a flexible metal sheet with a narrow upward fold. This arrangement can provide a low inductance path for the current.

20 Claims, 3 Drawing Sheets

(56) References Cited

U.S. PATENT DOCUMENTS

| | | |
|---|---|---|
| 5,105,430 A | 4/1992 | Mundinger et al. |
| 5,640,407 A | 6/1997 | Freyman et al. |
| 6,027,256 A | 2/2000 | Nightingale et al. |
| 6,385,226 B2 * | 5/2002 | McMinn et al. ............. 372/50.1 |
| 6,646,340 B2 | 11/2003 | Deeter et al. |
| 6,649,978 B2 | 11/2003 | Mukherjee et al. |
| 6,754,244 B2 | 6/2004 | Roellig et al. |
| 6,967,980 B2 | 11/2005 | Kawai |
| 7,039,083 B2 | 5/2006 | Carroll et al. |
| 7,060,515 B2 | 6/2006 | Stephens |
| 7,145,927 B2 | 12/2006 | Rice |
| 7,197,804 B2 | 4/2007 | Muller |
| 7,215,690 B2 | 5/2007 | Valiente |
| 7,264,409 B2 | 9/2007 | Kobayashi et al. |
| 7,457,333 B2 | 11/2008 | Moto |
| 7,466,732 B2 | 12/2008 | Stephens, IV |
| 7,504,701 B2 | 3/2009 | Moribayashi et al. |
| 2005/0201442 A1 * | 9/2005 | Luo et al. ........................ 372/69 |
| 2008/0008218 A1 | 1/2008 | Chen |
| 2011/0026551 A1 | 2/2011 | Stephens, IV et al. |
| 2012/0253331 A1 * | 10/2012 | Liu et al. ........................... 606/3 |

* cited by examiner

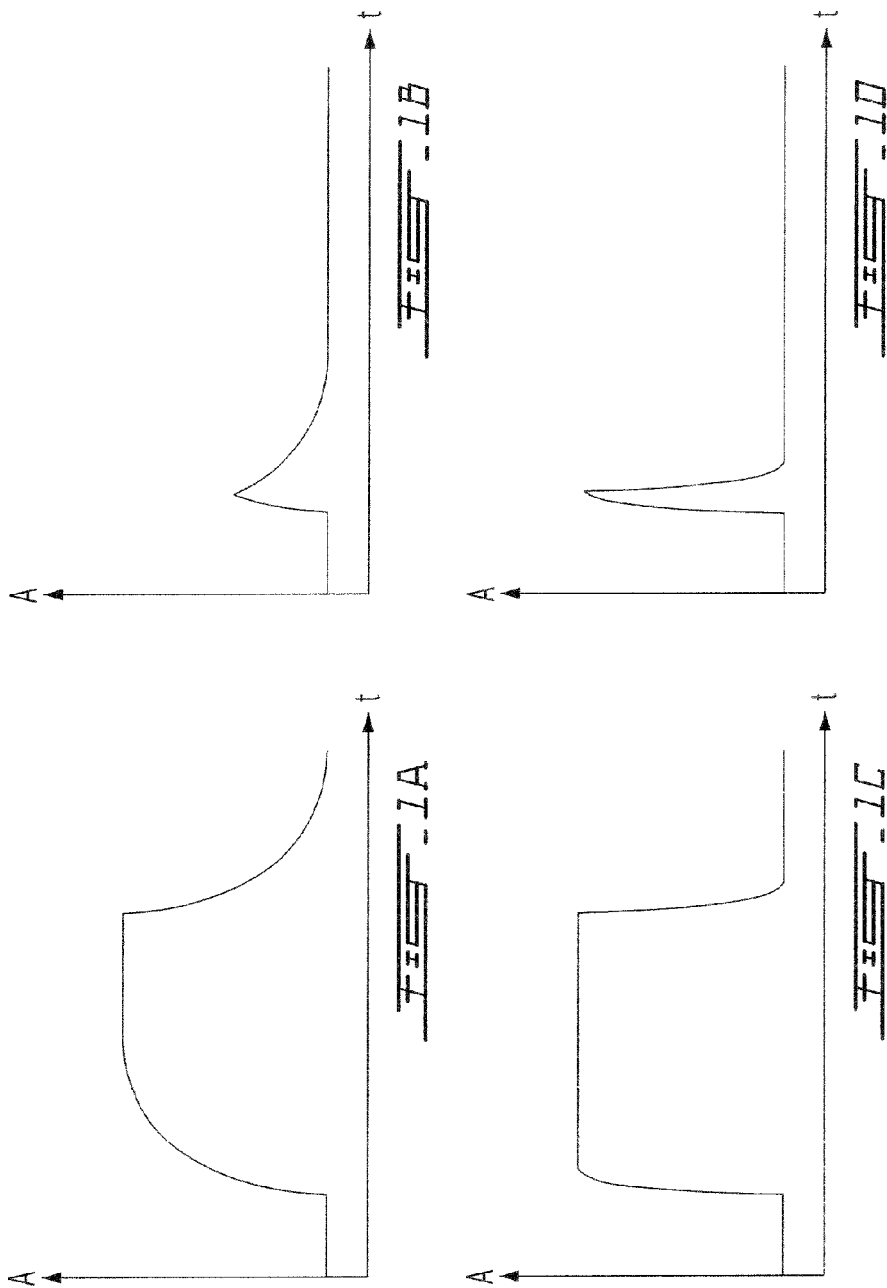

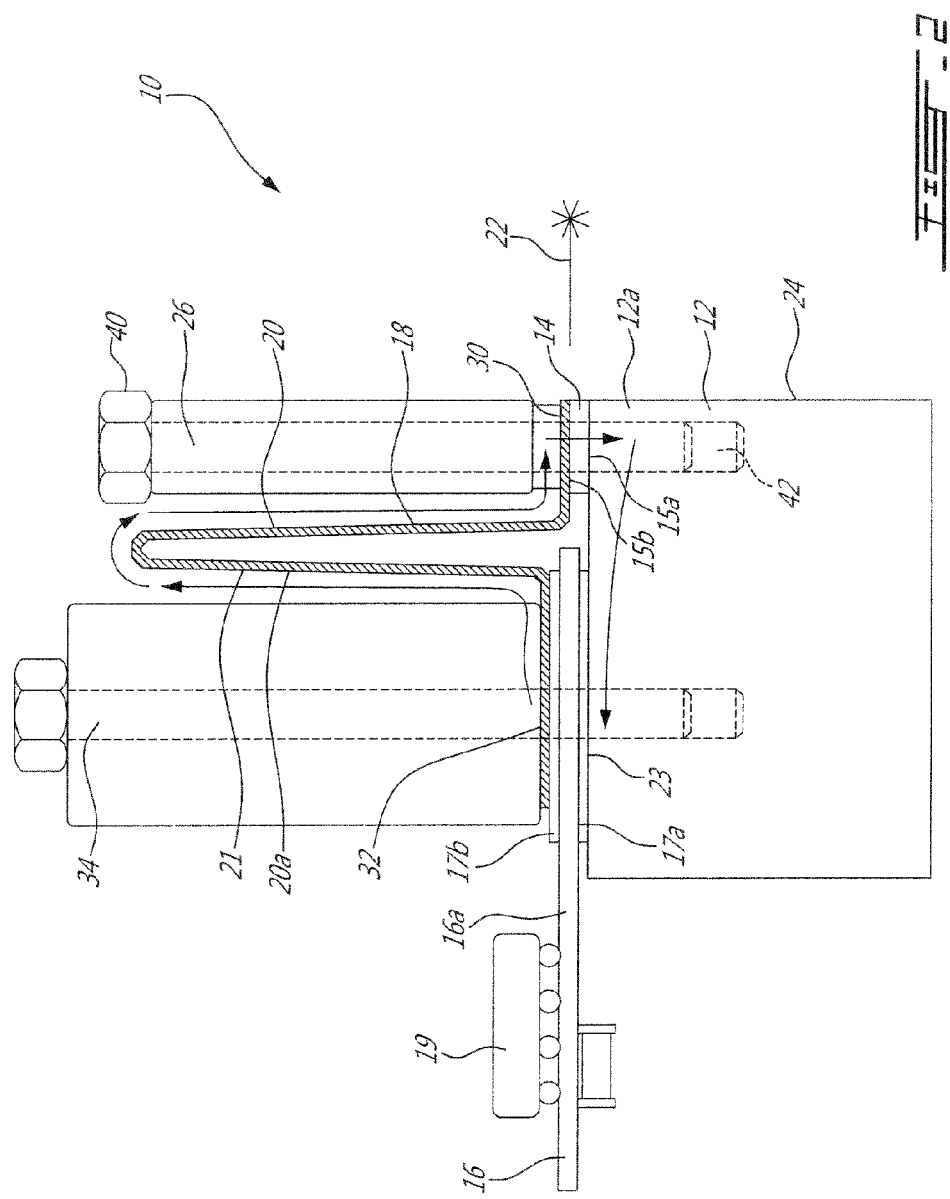

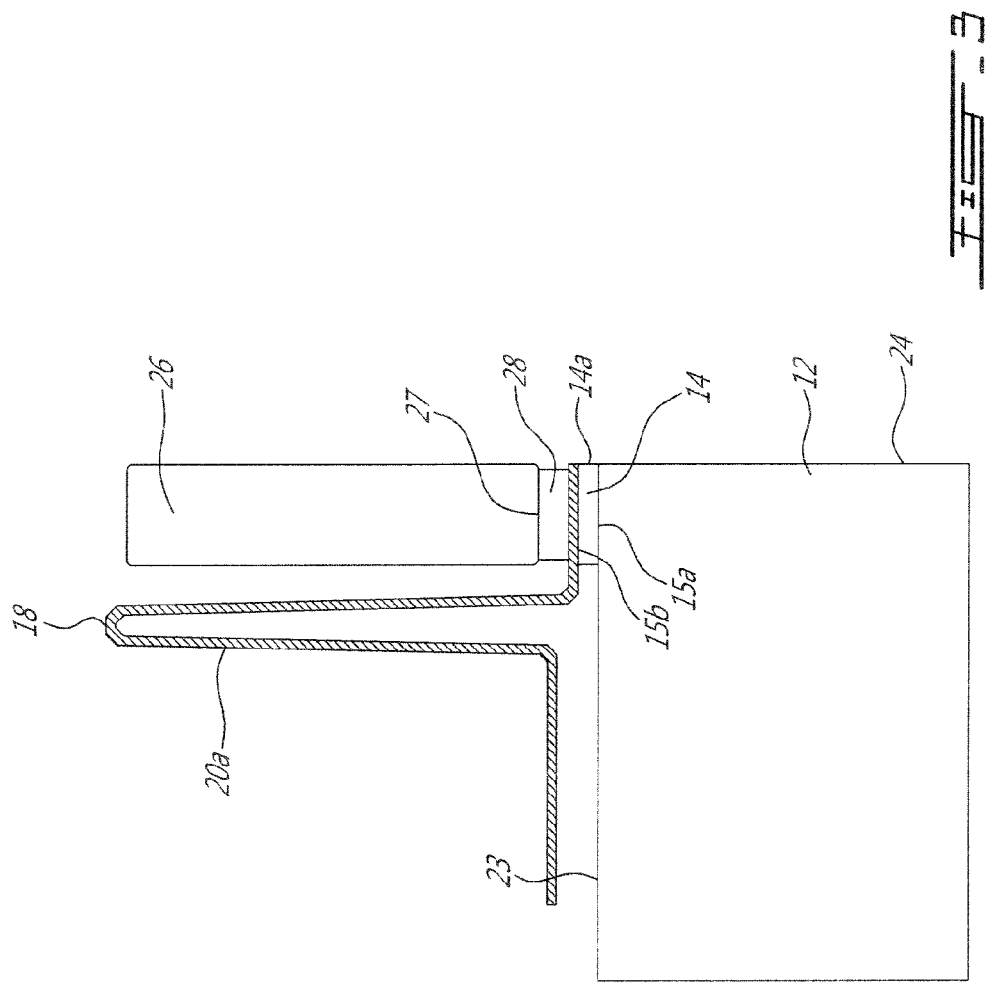

LOW INDUCTANCE LASER DIODE BAR MOUNT

BACKGROUND

Laser diode bars (hereinafter referred to as laser bars for simplicity) are well known electro-optical devices which typically consist of a bar of adjacent laser diodes. A laser bar has a P and a N electrical contacts on respective opposite faces to power the laser diodes via electrical connections.

Although former laser bar mounts were satisfactory to a certain degree, there remained room for improvement in the manner to mount the laser diode bar to a heat sink and to power it. For instance, the electrical connection circuit between the laser bar and the controlling electronics of former laser bar mounts had an inductance satisfactory when operating in continuous wave or quasi continuous wave modes, but there remained room for improvements when operating un pulse mode.

SUMMARY

Attempts to operate laser diode bars using former mount arrangements in pulse mode met with several limitations. One feature which is sought in pulse laser mode application is fast rise time and fast fall time. One limitation of former mount arrangements was due to the high inductance of the electrical connection circuit, which limited the ability to obtain satisfactory fast rise time and fall time.

This is illustrated in FIGS. 1A and 1B which show longer rise-time and fall-time as compared with FIGS. 1C and 1D. The consequences of longer rise/fall-time are even more important when the pulses are short, for a given current amplitude, such as illustrated when comparing FIGS. 1B and 1D with FIGS. 1A and 1C.

Range-gated active imaging, for instance, is an example of an application which can require a laser emitter having a short rise/fall time in order to achieve a satisfactory spatial discrimination.

The electrical connections of the mount assembly could be represented as a first order RL circuit, the current response rise time to a step function is:

$$I(t) = I_{max}(1 - e^{(t/\tau)}) \quad (1)$$

Where $\tau = L/R$

In this case, the 10-90% rise time constant is given by 2.2 T.

The system power efficiency requires a low series resistivity (R), which adversely increases the time constant. Therefore, as seen by the time constant equation, the inductance value must also be low to achieve short rise times and fall times.

The inductance value is affected by the loop surface area of the current going from the driver to the laser diode and back.

One way to reduce the loop surface area is to bring the driver (which is typically provided in the form of a printed circuit board) close to the laser bar. In an embodiment detailed herein, and schematically illustrated in FIG. 2, this has been achieved by positioning the printed circuit board driver directly onto the heat sink base, immediately adjacent the laser bar, in a manner using the heat sink base itself as an electrical connection between the driver and the laser bar. The other electrical connection can then be configured in a manner where the loop surface area, and therefore inductance, is kept much smaller than possible in former mounts.

A challenge also resided in finding a way to hold the driver and the laser bar on the heat sink base. One way which is detailed below is to use clamps in order to do this. In the case of the laser bar, this can advantageously avoid the requirement of soldering, which had been known to induced stress in the laser bar.

Finally, in the method of mounting the components to the heat sink base, it was desired that the second electrical connection (opposite to the heat sink base which acts as the first electrical connection), be adapted to lengthwise displacement, in order to account for variations in the exact positioning of the driver, while keeping a configuration which allows maintaining a satisfactorily low inductance. In an embodiment described herein, and schematized in FIG. 2, this is achieved by providing the second electrical connection in the form of a sheet of electrically conductive material having a narrow fold protruding normally from its otherwise planar body in the area corresponding roughly to between the driver and the laser bar. The elasticity of the metal in the fold allows to move the driver connection portion lengthwisely while the laser bar portion is secured to the laser bar, whereas the narrowness of the fold maintains a relatively small loop surface area given the benefit of added flexibility.

In accordance with one aspect, there is provided a laser mount arrangement comprising: a laser bar having a first electrical contact and a second electrical contact; a driver having a first electrical contact and a second electrical contact and having control electronics for driving the laser bar in pulsed mode; a heat sink base having a high thermal conductivity and an low electrical resistivity and having a connection face secured in electrical contact with both the laser bar first electrical contact and the driver first electrical contact, thereby forming a first electrical connection therebetween; a sheet of electrically conductive material secured in electrical contact with both the laser bar second electrical contact and the driver second electrical contact, thereby forming a second electrical connection therebetween.

In accordance with another aspect, there is provided a laser mount arrangement comprising: a laser bar and a printed circuit board positioned adjacent to one another and secured against a connection face of a heat sink base, the heat sink base being connected to and forming a first electrical connection between the laser bar and the printed circuit board, and a second electrical connection between the laser bar and the printed circuit board opposite the heat sink base.

In accordance with another aspect, there is provided a method of mounting a laser assembly, said method comprising, in sequence: securing a laser bar in electrical contact with a heat sink base, and a laser bar portion of an electrical connection to the laser bar; and subsequently securing a driver in electrical contact with the heat sink base and a driver portion of the electrical connection to the driver.

Many further features and combinations thereof concerning the present improvements will appear to those skilled in the art following a reading of the instant disclosure.

DESCRIPTION OF THE FIGURES

In the figures,

FIG. 1 includes FIG. 1A to 1D which are schematics showing pulses;

FIG. 2 is a schematic cross sectional view showing an example of a laser mount arrangement; and FIG. 3 is a view similar to FIG. 2 showing the laser mount arrangement at an intermediary mounting step.

DETAILED DESCRIPTION

FIG. 2 schematically shows an example of a low-inductance laser mount arrangement 10. In this example, a heat sink base 12, which is made of a material which has both high thermal conductivity and low electrical resistivity, receives both a laser bar 14 and a driver 16. In this case, the driver 16 is in the form of a printed circuit board 16a having control electronics 19 for driving the laser bar in pulsed mode and electrical contacts 17a, 17b of the driver on opposite sides thereof, and the laser bar 14 also has electrical contacts 15a, 15b on opposite sides thereof. Corresponding electrical contacts 15a, 17a of both the laser bar 14 and the driver 16 are connected with the heat sink base 12 which acts as a first electrical connection 12a therebetween. A second electrical connection 18 configured in a manner to generate low inductance, is connected with the both the laser bar 14 and the driver 16 on the side opposite the heat sink base 12. In this particular case, the second electrical connection 18 is provided in the form of a sheet of electrically conductive material 20. More particularly, a metal sheet 20a having a narrow fold 21 protruding normally from its otherwise planar body is used in this embodiment. The metal sheet 20a can be seen to have a laser bar portion 30 connected to a corresponding electrical contact 15b of the laser bar 14, and a driver portion 32 connected to a corresponding electrical contact 17b of the driver printed circuit board 16a, the fold 21 being between the driver portion 32 and the laser bar portion 30 of the metal sheet 20a. The use of the narrow fold 21 will be detailed below. During operation of the laser bar 14, electric current travels along the loop indicated with the arrows and the laser diodes of the laser bar emit a light signal 22.

The area of the heat sink base 12 which receives the electrical contacts 15a, 17a is a face which is referred to herein as the contact face 23. In this specific example, the contact face 23 is planar and unitary, and a planar front face 24 is also formed in the heat sink base 12.

FIG. 3 shows an intermediate step of an example method for mounting the laser bar 14 and driver printed circuit board 16a in a solderless manner. Referring to FIG. 3, it is preferred in this example to mount the laser bar 14 (i.e. secure the laser bar 14 to the heat sink base 12 and metal sheet 20a) prior to mounting the driver printed circuit board 16a. Henceforth, the laser bar 14 is first positioned on the contact face 23 of the heat sink base 12, with its front facet 14a positioned flush with the front face 24 of the heat sink base 12. In this case, the laser bar 14 is positioned with its P-side electrical contact 15a on the heat sink base 12. Henceforth, the laser bar 14 is secured in place here by way of a laser bar clamp 26 which has a pressing surface 27 which presses downwardly as bolts 40 having an abutting head and a stem extending through the laser bar clamp 26 at opposite transversal ends thereof are screwed into threaded bores 42 (see FIG. 2) provided in the heat sink base 12. The laser bar 14 can be held in place by a temporary structure (not shown) as the laser bar clamp 26 is being applied. Here, the metal sheet 20a is placed against the N-side electrical contact 15b of the laser bar 14 and is maintained pressed thereagainst during use by the laser bar clamp 26. To reduce the likelihood of short-circuiting the laser bar 14, the laser bar clamp 26 can be made of a non-conductive material, in which case the pressing surface 27 can be directly applied to the metal sheet 20a. Otherwise, a layer 28 of an electrically insulating material, such as a Teflon™ strip for instance, can be applied to the pressing surface 27 and used as an insulating bushing between the metal sheet 20a and the laser bar clamp 26 as illustrated for example. Henceforth, the laser bar 14 is pressed and maintained into electrical and thermal contact with the heat sink base 12 at which point the temporary structure previously holding it in place can be removed.

In an alternate embodiment, the laser bar can be secured to the heat sink base by soldering, although this is not preferred here because soldering can have undesired effects on the laser bars such thermal stress, damage to the optical facets of the laser emitters and misalignment of bars individual emitters optical axis, known in the art as the 'smile' of the laser bar.

Referring back to FIG. 2, the next step in the example mounting method is to secure the driver printed circuit board 16a to the heat sink base 12 and metal sheet 20a.

It will be understood that the electrical contacts 17a, 17b of the driver 16 are positioned so close to the laser bar 14 that the printed circuit board 16a and the laser bar 14 can be said to be immediately adjacent. For illustrative purposes, the distance between the printed circuit board 16a and the laser bar 14 can be of the order of 500 µm for instance. This proximity contributes in reducing the loop surface area and therefore manages inductance. An electrical contact 17a on one side of the printed circuit board 16a is placed in direct electrical contact with the heat sink base 12, whereas an electrical contact 17b on the other side of the printed circuit board 16a is placed in direct electrical contact with the driver portion 32 of the metal sheet 20a. In this embodiment, the electrical contact is secured by way of a second clamp 34, of non-conductive material, which maintains a pressing force sandwiching the metal sheet 20a and printed circuit board 16a in a similar manner than that described above in relation with the laser bar 14.

In other embodiments, the electrical contacts can be maintained by soldering, or otherwise, for instance.

Those skilled in the art will recognize that given this sequence of assembly and the components involved, it is desirable here to allow a certain amount of play for lengthwise displacement of the second electrical connection 20, to account in possible stresses during assembly and variations of the relative position or distance between the driver 16 electrical contacts 17b, 17a and the laser bar 14 electrical contacts 15a, 15b and prevent lateral forces applied to the second electrical connection 20 to be directly transferred onto the laser bar 14. Henceforth, both features of low inductance and flexibility are desired in the second electrical connection 20.

It will be noted here that in this specific example, the second electrical connection 20 is provided in the form of a metal sheet 20a which has a fold 21 in it, the fold 21 protruding upwardly. The presence of this fold 21, combined with the natural elasticity of the metal sheet 20a, allows flexibility to move the printed circuit portion 32 of the metal sheet 20a lengthwisely to adapt to the exact position of the printed circuit board 16a, while the laser bar portion 30 of the metal sheet 20a is firmly secured to the laser bar 14. Further, the fold can absorb lengthwise compression or tension forces and buffers them from affecting the laser bar 14 or the quality of the electrical contact. The presence of the fold 21 will have an effect on the inductance, but the degree of the effect can be limited by making the fold 21 narrow, in which case the surface area of the circuit loop is limited. In the case where the driver 16 and laser bar 14 are held by corresponding clamps 26, 34, as in the illustrated example of FIG. 2, the narrow fold 21 can have a width of the same order of magnitude as the distance between the laser bar 14 and printed circuit board 16a, and a height several times greater than its width, protruding into the area between the two clamps 26, 34, for instance.

In this particular embodiment, a flexible printed circuit board was selected. Such a flexible printed circuit board can have a thickness of 125-150 µm for instance, which is significantly less than most rigid circuit boards, and thus closer to that of the laser bar 14. Having comparable thicknesses between the printed circuit board and the laser bar is another factor in managing inductance.

In the exemplary embodiment described above and illustrated, the laser was found to be satisfactorily operated in a pulsed mode at currents in the order of 40-90 A at pulse widths ranging between 150 ns and 80 μs and rise time below 125 ns at a frequency ranging between 2.5 and 100 KHz for instance. This performance is obtained given the relatively low electrical resistivity of the electrical connections between the printed circuit board 16a and the laser bar 14 (~3 mOhms), and relatively low inductance (~2 nH). The thermal resistance of the laser bar 14 in contact with heat sink base 12 was satisfactory, of the order of 1.0° C./W, which led to satisfactory low temperature rise of the laser bar 14. Further, using a heat sink base 12 made of gold plated copper and having a surface flatness below λ/2, a smile (misalignment of the bars individual emitters optical axis along an axis parallel to the heat sink base surface) of less than 0.5 μm was achieved. A laser bar 14 having 19 adjacent laser diodes was used in this embodiment although the exact number can vary strongly depending on the embodiments and desired features. In this specific example, the heat sink base and the metal sheet are made of gold-plated copper, a material which was selected here for its high electrical and thermal conductivity. Of course, in alternate embodiments, other materials having satisfactory properties can be used instead.

It will be noted that in the embodiment described above and illustrated, the driver 16 is provided in the form of a flexible printed circuit board 16a where the electrical contacts 17a, 17b of the driver 16 are provided directly on the printed circuit board 16a. In an alternate embodiment, for instance, the driver can be provided in the form of a rigid printed circuit board connected to a transmission line, in which case a device such as a strip line flat cable can connect to the printed circuit board and provide the electrical contacts of the driver to the heat sink base and to the second electrical connection. Other embodiments are possible as well.

As can be seen therefore, the examples described above and illustrated are intended to be exemplary only. The scope is indicated by the appended claims.

What is claimed is:

1. A laser mount arrangement comprising:
   a laser bar having a first electrical contact and a second electrical contact;
   a driver having a first electrical contact and a second electrical contact and having control electronics for driving the laser bar in pulsed mode;
   a heat sink base having high thermal conductivity and a low electrical resistivity and having a connection face secured in electrical contact with both the laser bar first electrical contact and the driver first electrical contact, thereby forming a first electrical connection therebetween;
   a sheet of electrically conductive material secured in electrical contact with both the laser bar second electrical contact and the driver second electrical contact, thereby forming a second electrical connection therebetween.

2. The laser mount of claim 1 wherein the sheet of electrically conductive material has a fold protruding upwardly.

3. The laser mount of claim 2 wherein the fold has a height several times greater than its width and the electrically conductive material is elastic to allow adapting its width to a given distance between electrical connections.

4. The laser mount of claim 1, further comprising a laser bar clamp removably fastened to the heat sink base, sandwiching the laser bar and sheet of electrically conductive material therebetween.

5. The laser mount of claim 4 wherein the laser bar clamp has a pressing portion in contact with the sheet of electrically conductive material, said pressing portion being made of an electrically insulating material.

6. The laser mount of claim 4 wherein the laser bar clamp has a layer of electrically insulating material pressed against the sheet of electrically conductive material.

7. The laser mount of claim 1 wherein the laser bar is soldered to the heat sink base.

8. The laser mount of claim 1 wherein the driver, the driver first electrical contact, and the driver second electrical contact are provided as part of a printed circuit board positioned immediately adjacent to the laser bar.

9. The laser mount of claim 8, further comprising a printed circuit board clamp removably fastened to the heat sink base, sandwiching the printed circuit board and sheet of electrically conductive material therebetween.

10. The laser mount of claim 8 wherein the printed circuit board has a thickness of less than twice a thickness of the laser bar.

11. The laser mount of claim 8 wherein the printed circuit board is a flexible printed circuit board.

12. The laser mount of claim 1 wherein the high thermal conductivity is above 250 W/(m·K) and the low electrical resistivity is below $2.5 \times 10^{-8}$ (Ω·m).

13. The laser mount of claim 1 wherein the connection face is a unitary planar surface.

14. The laser mount of claim 1 wherein the inductance attributable to the first and second electrical connections is below 5 nH, preferably below 3 nH, more preferably below 2 nH.

15. The laser mount of claim 1 wherein the combined resistivity of the first and second electrical connections is below 10 mOhms, preferably below 5 mOhms, more preferably below 3 mOhms.

16. The laser mount of claim 1 wherein at least one of the heat sink base and/or metal sheet are made of copper.

17. A laser mount arrangement comprising: a laser bar and a driver printed circuit board positioned adjacent to one another and secured against a connection face of a heat sink base, the heat sink base being connected to and forming a first electrical connection between the laser bar and the printed circuit board, and a second electrical connection between the laser bar and the printed circuit board opposite the heat sink base.

18. A method of mounting a laser assembly, said method comprising, in sequence:
   securing a laser bar in electrical contact with a heat sink base, and a laser bar portion of an electrical connection to the laser bar; and
   subsequently securing a driver in electrical contact with the heat sink base and a driver portion of the electrical connection to the driver.

19. The method of claim 18 wherein the step of subsequently securing includes moving the driver portion of the electrical connection relative to the laser bar portion of the electrical connection.

20. The method of claim 18 wherein the step of securing a laser bar includes fastening a clamp to the heat sink with the laser bar and laser portion of the electrical connection sandwiched therebetween.

* * * * *